United States Patent
Fronheiser et al.

(10) Patent No.: US 9,679,972 B1
(45) Date of Patent: Jun. 13, 2017

(54) THIN STRAIN RELAXED BUFFERS WITH MULTILAYER FILM STACKS

(71) Applicants: GLOBALFOUNDRIES Inc., Grand Cayman, KY (US); International Business Machines Corporation, Armonk, NY (US); STMicroelectronics, Inc., Coppell, TX (US)

(72) Inventors: Jody Fronheiser, Delmar, NY (US); Murat Kerem Akarvardar, Saratoga Springs, NY (US); Stephen Bedell, Yorktown Heights, NY (US); Joel Kanyandekwe, Grenoble (FR)

(73) Assignees: GLOBALFOUNDRIES Inc., Grand Cayman (KY); International Business Machines Corporation, Armonk, NY (US); STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/133,683

(22) Filed: Apr. 20, 2016

(51) Int. Cl.
*H01L 29/775* (2006.01)
*H01L 29/165* (2006.01)
*H01L 21/02* (2006.01)
*H01L 29/78* (2006.01)

(52) U.S. Cl.
CPC ...... *H01L 29/165* (2013.01); *H01L 21/02694* (2013.01); *H01L 29/7849* (2013.01)

(58) Field of Classification Search
CPC ............... H01L 29/165; H01L 29/7849; H01L 21/02694
See application file for complete search history.

(56) References Cited

U.S. PATENT DOCUMENTS

| | | | |
|---|---|---|---|
| 2012/0229167 A1* | 9/2012 | Jain | B82Y 10/00 326/122 |
| 2016/0233305 A1* | 8/2016 | Seacrist | H01L 21/283 |

OTHER PUBLICATIONS

D. D'Angelo et al, "Localization of He induced nanovoids in buried Si 1xGexthin films", Journal of Applied Physics, 103, 016104 (2008).
L. H. Wong, et al., "Low-dislocation-density strain relaxation of SiGe on a Si Ge Si Ge C buffer layer", Applied Physics Letters, 88, 041915 (2006).

* cited by examiner

*Primary Examiner* — Thomas L Dickey
*Assistant Examiner* — Damon Hillman
(74) *Attorney, Agent, or Firm* — Heslin Rothenberg Farley and Mesiti PC; Nicholas Mesiti

(57) ABSTRACT

A semiconductor structure can include a substrate and a substrate layer. The substrate can be formed of silicon and the substrate layer can be formed of silicon germanium. Above the substrate and under the substrate layer there can be provided a multilayer substructure. The multilayer substructure can include a first layer and a second layer. The first layer can be formed of a first material and the second layer can be formed of second material. A method can include forming a multilayer substructure on a substrate, annealing the multilayer substructure, and forming a substrate layer on the multilayer substructure.

15 Claims, 6 Drawing Sheets

THIN STRAIN RELAXED BUFFERS WITH MULTILAYER FILM STACKS

TECHNICAL FIELD

The present disclosure relates to semiconductor structures in general and buffer substructures in general.

BACKGROUND OF THE INVENTION

Semiconductor structures having silicon germanium have been proposed. These structures can have a supporting silicon layer substrate and a silicon germanium substrate layer over the silicon substrate. On the silicon germanium substrate layer there can be a silicon layer. The silicon germanium substrate layer can provide tensile strain to the silicon layer.

Defects can occur in a semiconductor structure having a silicon germanium substrate layer. Techniques to mitigate defect formation have included implantation with various materials, e.g., He, H, Ar.

BRIEF DESCRIPTION

A semiconductor structure can include a substrate and a substrate layer. The substrate can be formed of silicon and the substrate layer can be formed of silicon germanium. Above the substrate and under the substrate layer there can be provided a multilayer substructure. The multilayer substructure can include a first layer and a second layer. The first layer can be formed of a first material and the second layer can be formed of second material. A method can include forming a multilayer substructure on a substrate, annealing the multilayer substructure, and forming a substrate layer on the multilayer substructure.

BRIEF DESCRIPTION OF THE SEVERAL VIEWS OF THE DRAWINGS

One or more embodiments of the present disclosure are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
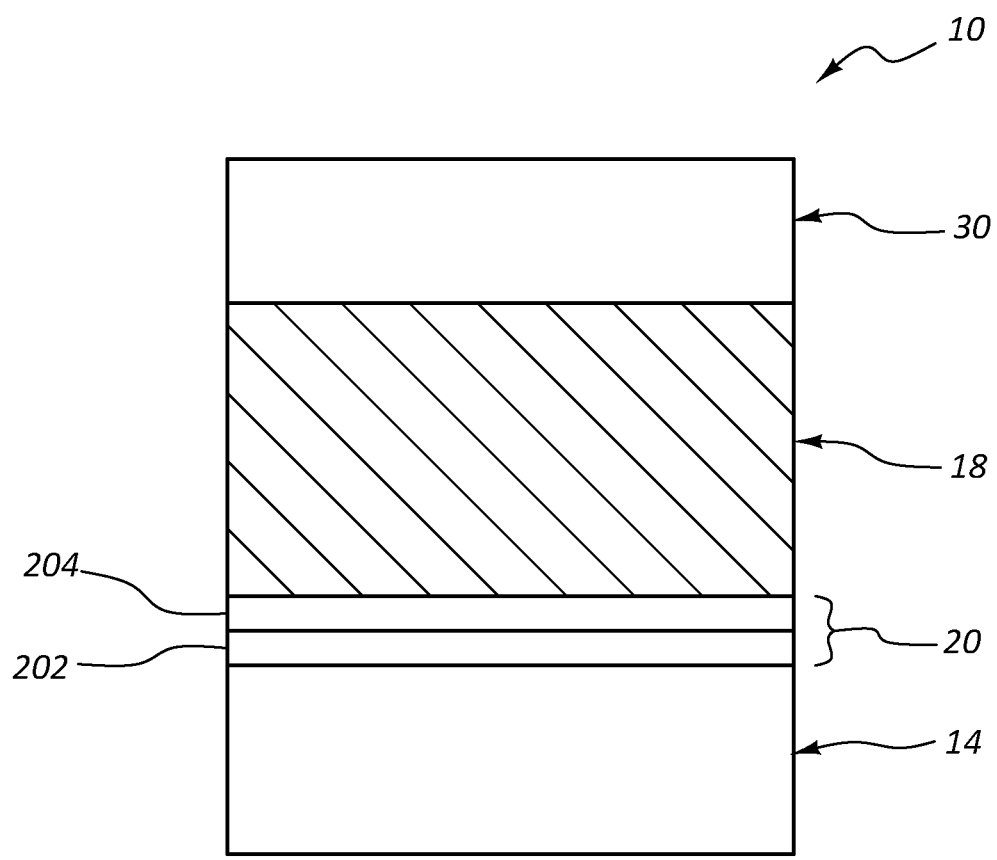
FIG. 1 is a cross sectional side view of a semiconductor structure having a multilayer substructure in one embodiment.

In one embodiment, as shown in FIG. 1 a semiconductor structure 10 can include a substrate 14 and a substrate layer 18. The substrate 14 can be formed of silicon and the substrate layer 18 can be formed of silicon germanium. Over the substrate 14 and under the substrate layer 18 there can be provided a multilayer substructure 20.

In one embodiment, the multilayer substructure 20 can include one or more first layer and one or more second layer. The one or more first layer can be formed of a first material. The one or more second layer can be formed of a second material different from the first material. At least one layer of the first layer and at least one layer of the second one or more layer can be disposed in an alternating arrangement. In one embodiment, the one or more first layer and the one or more second layer can be of different material, each selected from the group consisting of silicon (Si), silicon germanium (SiGe) and silicon germanium formed with carbon (SiGe:C). In one embodiment, the one or more first layer can be formed of silicon (Si) and the one or more second layer can be formed of silicon germanium (SiGe). In one embodiment, the one or more first layer can be formed of silicon (Si) and the one or more second layer can be formed of silicon with carbon (Si:C) or silicon germanium with carbon (SiGe:C). In one embodiment, the one or more first layer can be formed of silicon germanium (SiGe) and the one or more second layer can be formed of silicon with carbon (Si:C) or silicon germanium with carbon (SiGe:C).

In one embodiment, semiconductor structure 10 can include a device layer 30. One or more device can be formed on device layer 30. Devices that can be formed on device layer 30 can be, e.g., field effect transistors (FET), bipolar junction transistors, diodes and/or capacitors. Device layer 30 in one embodiment can be formed of silicon. Device layer 30 in one embodiment can be formed of silicon germanium (SiGe). In one embodiment substrate layer 18 can have a thickness of between about 10 nm and about 70 nm, and device layer 30 can have a thickness of between about 10 nm and about 70 nm. In one embodiment, substrate layer 18 and device layer 30 can have substantially common thicknesses.

In one embodiment, semiconductor structure 10 can be adapted so that substrate layer 18 provides strain to device layer 30. For example, germanium atoms are larger than silicon atoms. Accordingly, where substrate layer 18 is formed of silicon germanium and device layer 30 is formed of silicon, substrate layer 18 can provide strain to device layer 30. Semiconductor structure 10 can be adapted so that substrate layer 18 provides tensile strain to nFET regions of semiconductor structure 10 and further so that substrate layer 18 provides compressive strain to pFET regions of semiconductor structure 10.

In one embodiment, one or more first layer 202 can be formed of silicon germanium (SiGe) and one or more second layer 204 can be formed of silicon (Si). In one embodiment, one or more first layer 202 can be formed of silicon (Si) and one or more second layer 204 can be formed of silicon germanium (SiGe). In one embodiment, one or more first layer 202 can be formed of silicon germanium (SiGe) and one or more second layer 204 can be formed of silicon with carbon (Si:C) or silicon germanium with carbon (SiGe:C). In one embodiment, one or more first layer 202 can be formed of silicon with carbon (Si:C) or silicon germanium with carbon (SiGe:C) and one or more second layer 204 can be formed of silicon germanium (SiGe).

In one embodiment, where one or more first layer 202 or one or more second layer 204 is formed of silicon germanium with carbon (SiGe:C) or silicon with carbon (Si:C), the atomic percent of Ge of the one or more first layer 202 or more second layer 204 can be from about 0% to about 40%.

In one embodiment, where one or more first layer 202 or more second layer 204 is formed of silicon germanium with carbon (SiGe:C) or silicon with carbon (Si:C), the atomic percent of carbon of the one or more first layer 202 or one or more second layer 204 can be from about 0% to about 1.5%. In one embodiment, where one or more first layer 202 or one or more second layer 204 is formed of silicon germanium with carbon (SiGe:C), the atomic percent of Ge of the one or more first layer 202 or one or more second layer 204 can be from about 20% to about 25%. In one embodiment, where one or more first layer 202 or one or more second layer 204 is formed of silicon germanium with carbon (SiGe:C) or silicon with carbon (Si:C), atomic percent of carbon of the one or more first layer 202 or one or more second layer 204 can be from about 0.4% to about 0.6%.

In one embodiment, where one or more first layer 202 or more second layer 204 is formed of silicon germanium with carbon (SiGe:C) or silicon with carbon (Si:C), the atomic percent of Ge of the one or more first layer 202 or one or more second layer 204 can be from about 0% to about 40%, and the atomic percent of carbon of the one or more first layer 202 or one or more second layer 204 can be from about 0% to about 1.5%. In one embodiment, where one or more first layer 202 or more second layer 204 is formed of silicon germanium with carbon (SiGe:C), the atomic percent of Ge of the one or more first layer 202 or one or more second layer 204 can be from about 20% to about 25% and the atomic percent of carbon of the one or more first layer 202 or one or more second layer 204 can be from about 0.4% to about 0.6%.

It was determined that defects in lower substructures of semiconductor structure 10 can affect upper substructures of semiconductor structure 10. Defects can propagate upward on semiconductor structure 10 and can terminate at device layer 30. Defects that are susceptible to propagation upward on a semiconductor structure 10 include, e.g., threading dislocation defects and/or a stacking fault defects. Embodiments herein recognize that multilayer substructure 20 can reduce such defects. Without being bound to a theory multilayer substructure 20 can reduce defects by providing multiple material interfaces that allow defects to bend and terminate prior to propagating upward on semiconductor structure 10.

In one embodiment, defect restricting provided by multilayer substructure 20 can be tuned by selection of thicknesses of layers that make up the multilayer substructure 20. In one embodiment, making one or more layer of multilayer substructure 20 thinner can increase a defect restricting provided by multilayer substructure 20. In one embodiment, one or more layer of multilayer substructure 20 can be provided to have a thickness of less than a threshold thickness. In one embodiment, one or more layer of multilayer substructure 20 can have a thickness of about 30 nm or less. In one embodiment, one or more layer of multilayer substructure 20 can have a thickness of about 20 nm or less. In one embodiment, one or more layer of multilayer substructure 20 can have a thickness of about 15 nm or less. In one embodiment, one or more layer of multilayer substructure 20 can have a thickness of about 10 nm or less. In one embodiment, one or more layer of multilayer substructure 20 can have a thickness of about 5 nm or less. In one embodiment, one or more layer of multilayer substructure 20 can have a thickness of about 3 nm or less.

In one embodiment, multilayer substructure 20 can have a total thickness of from about 50 nm to about 150 nm and each layer of multilayer substructure 20 can have a substantially common thickness of about T/N where T is the total thickness of multilayer substructure 20 and N is the number of layers of multilayer substructure 20. In one embodiment, layers of multilayer substructure 20 can have different thicknesses.

Figure 2:
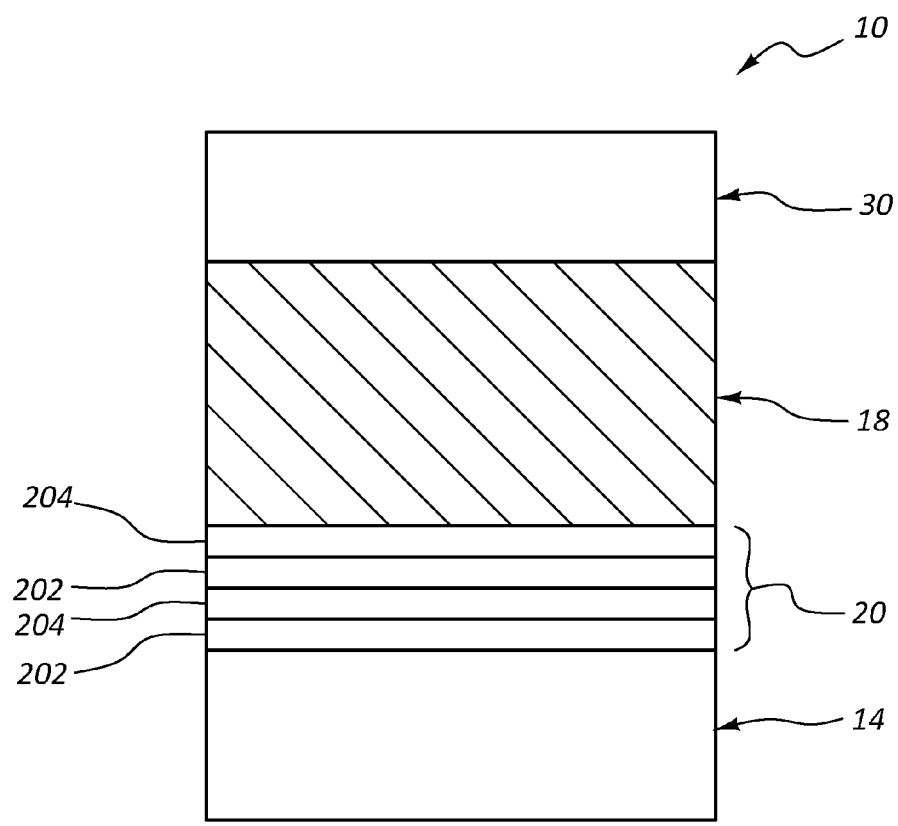
FIG. 2 is a cross sectional side view of a semiconductor structure having a multilayer substructure in one embodiment.

In one embodiment, multilayer substructure 20 can include a plurality of first layers. In one embodiment, multilayer substructure 20 can include a plurality of second layers. In the embodiment, of FIG. 2 multilayer substructure 20 of semiconductor structure 10 includes a plurality of first layers 202 and plurality of second layers 204.

In one embodiment, the multilayer substructure 20 includes a plurality of first layers, e.g., layers 202 and a plurality of second layers, e.g., layers 204, the plurality of first layers formed of a first material, the plurality of second layers formed of a second material different from a material of the plurality of first layers, wherein each of the plurality of first layers has first substantially common thickness, and wherein each of the plurality of second layers has a second substantially common thickness, the second substantially common thickness being different from the first substantially common thickness. In one example, first substantially common thickness and the second substantially common thickness can have a ratio of about 1:2. In one example, first substantially common thickness and the second substantially common thickness can have a ratio of about 2:1. In one example, first substantially common thickness and the second substantially common thickness can have a ratio of about 1:3. In one example, first substantially common thickness and the second substantially common thickness can have a ratio of about 3:1. In one example, first substantially common thickness and the second substantially common thickness can have a ratio of about 4:1. In one example, first substantially common thickness and the second substantially common thickness can have a ratio of about 1:4. The material differentiation scheme for the plurality of first layers and the plurality of second layers can be according to any material differentiation scheme set forth herein.

Figure 3:
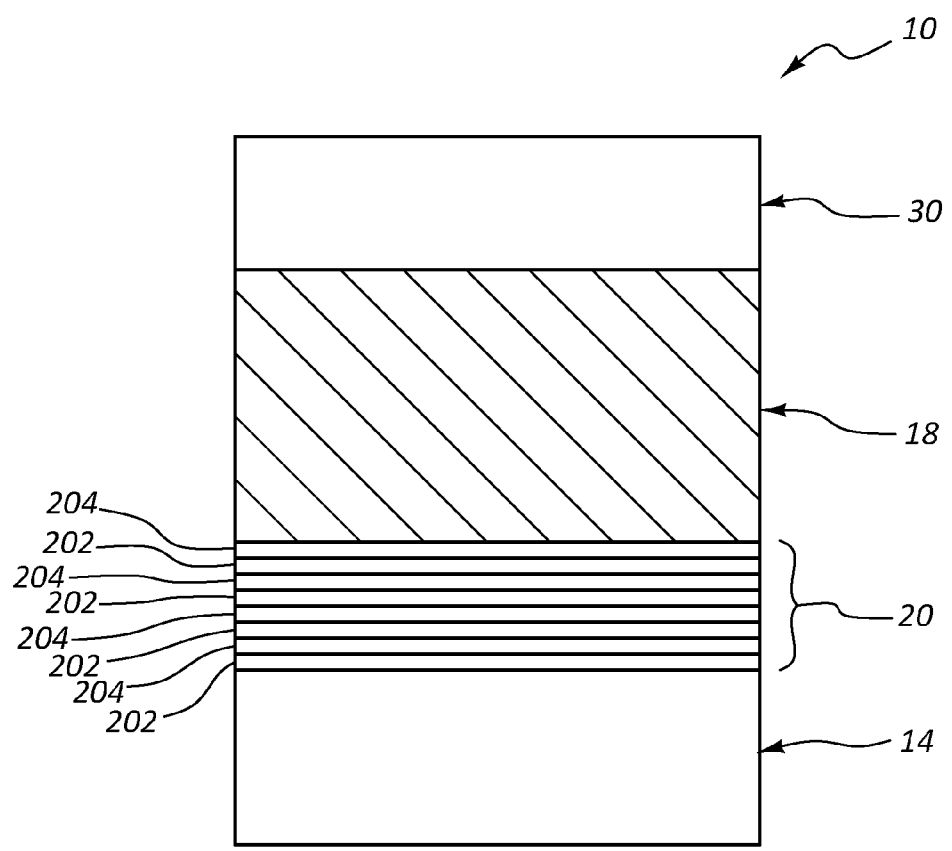
FIG. 3 is a cross sectional side view of a semiconductor structure having a multilayer substructure in one embodiment.

Referring to the embodiment of FIG. 1, the embodiment of FIG. 1 can include the pattern of first layer 202 and second layer 204 repeated 1 time. In another embodiment, it is seen that in a multilayer substructure of another embodiment, the pattern of first layer 202 and second layer 204 can be repeated N times. In one embodiment of FIG. 2, the alternating pattern of first layer 202 and second layer is repeated two times. In one embodiment of FIG. 3, the alternating pattern of first layer 202 and second layer 204 is repeated three times. In one embodiment, one or more first layers 202 can be formed of silicon germanium (SiGe) and one or more second layers 204 can be formed of silicon (Si). In one embodiment, one or more first layers 202 can be formed of silicon germanium and one or more second layers 204 can be formed of silicon with carbon (Si:C) or silicon germanium with carbon (SiGe:C).

Figure 4:
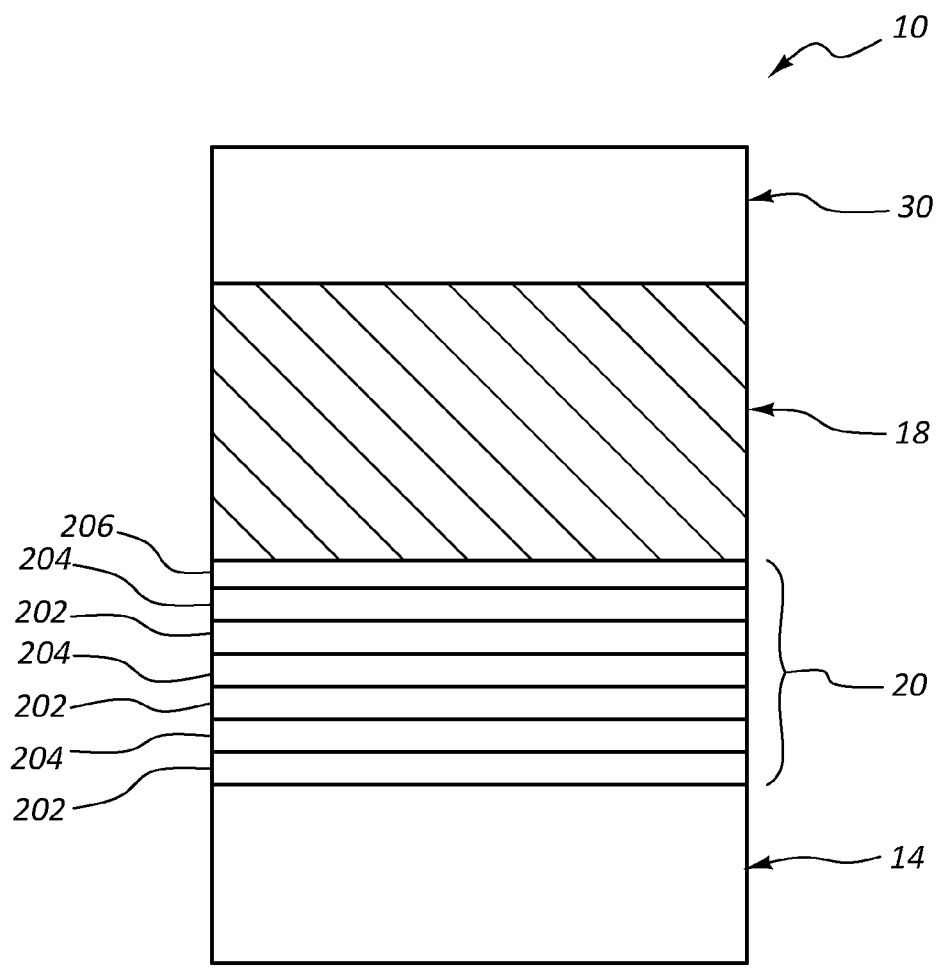
FIG. 4 is a cross sectional side view of a semiconductor structure having a multilayer substructure in one embodiment.

In one embodiment, multilayer substructure 20 can have one or more first layers of a first material, one or more second layers of a second material and up to one or more Nth layers of an Nth material. In the example of FIG. 4, multilayer substructure 20 includes one or more (e.g., 4) first layers 202 of a first material (e.g., SiGe), one or more (e.g., 3) second layers of a second material (e.g., Si:C or SiGe:C) and one or more third layer 206 of a third material (e.g., Si). In one embodiment of FIG. 4, layers 202 can be formed of SiGe, layers 204 can be formed of Si:C or SiGe:C, and layer 206 can be formed of Si. In one embodiment, layers 202 and 204 can have a thickness of 30 nm or less and layer 206 can have a thickness of 10 nm or less. In one embodiment, layers 202 and 204 can have a thickness of 20 nm or less and layer 206 can have a thickness of 5 nm or less. In one embodiment, layers 202 and 204 can have a thickness of 15 nm or less and layer 206 can have a thickness of 3 nm or less.

Figure 5:
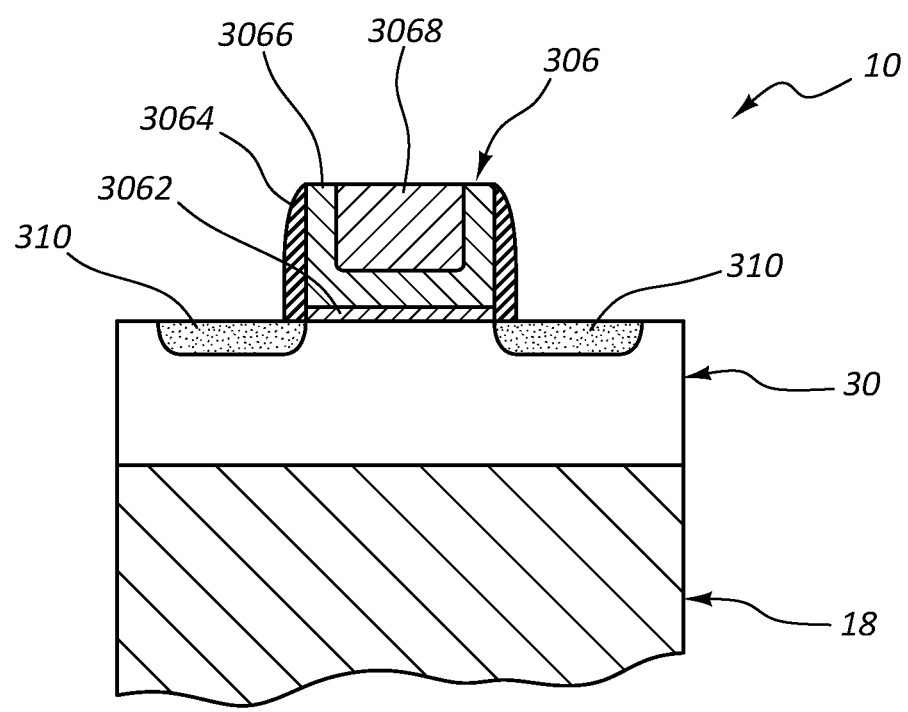
FIG. 5 is a cross sectional side view semiconductor structure having a device formed in a device layer in one embodiment.

Referring to FIG. 5 one or more device can be formed on device layer 30. An example of a device that can formed on device layer 30 is a field effect transistor 302 (FET). As shown in FIG. 5, FET 302 can include gate 306, a first source-drain 310, a second source-drain 310, and a channel region 314. Gate 306 can be formed using a gate first or a gate last process. Gate 306 can include gate dielectric 3062, gate spacer 3064 one or more conductive work function layer 3066 and gate capping layer 3068. In one embodiment, FET 302 can be formed on device layer 30 in accordance with a planar architecture. In one embodiment, device layer 30 can be patterned into fins and FET 302 can be formed on device layer 30 in accordance with a finFET architecture.

Defect inhibiting properties of semiconductor structure 10 can be tuned with use of various process controls. In one embodiment, multilayer substructure 20 can be subject to annealing for removal of defects therein. In one embodiment, at least one layer of multilayer substructure 20 can be doped with a light atom implant. Doping of at least one layer of multilayer substructure 20 can provide a nucleation center which can be helpful in inhibiting defects.

Figure 6:
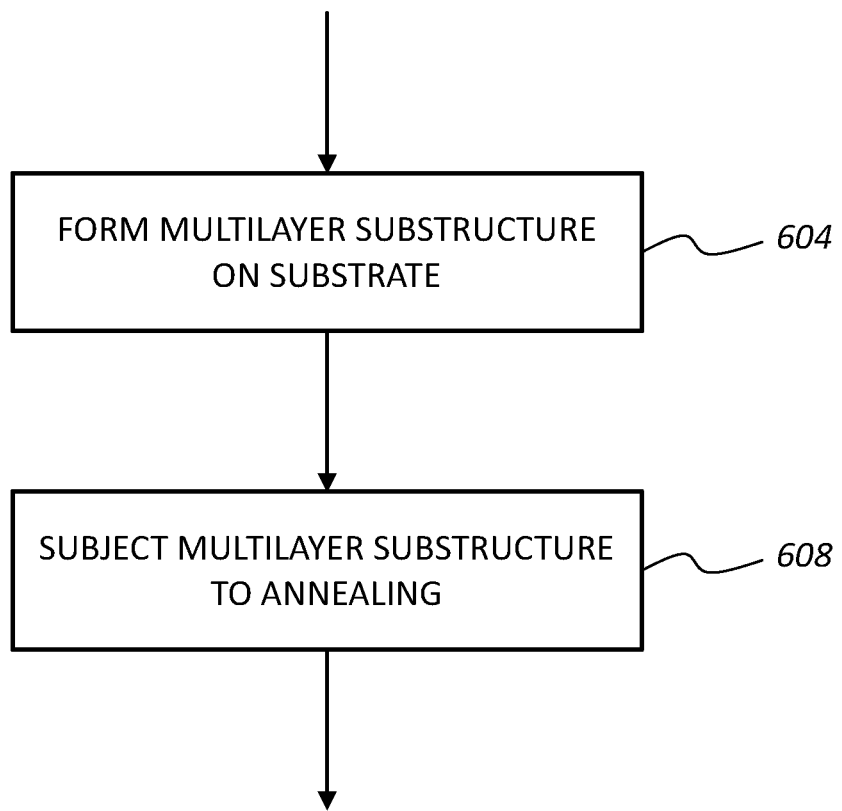
FIG. 6 is a flow diagram illustrating a method of fabricating a semiconductor structure in one embodiment.

A method of fabrication of a semiconductor structure is described with reference to FIG. 6. At block 604 a multilayer substructure 20 can be formed on a substrate 14. At block 608, the multilayer substructure 20 can be subject to annealing. In one embodiment the annealing can include annealing at a temperature of a greater than 800 degrees C. In one embodiment, the annealing can include annealing at a temperature of between about 950 degrees C. and about 1000 degrees C.

In one embodiment, prior to annealing at block 608, at least one layer of multilayer substructure 20 can be doped with a light atom implant. In one embodiment a light atom implant can be selected from the group consisting of He, and H.

With multilayer substructure 20 formed, substrate layer 18 can be formed on multilayer substructure 20. Device layer 30 can be formed on substrate layer 18 and one or more device, e.g., a FET as shown in FIG. 5 can be formed on device layer 30.

Each of the formed layers as set forth herein, e.g., layer 14, layer 202, layer 204, layer 206, layer 18, layer 30 can be formed by way of deposition using any of a variety of deposition processes, including, for example, atomic layer deposition (ALD), chemical vapor deposition (CVD), molecular beam epitaxy (MBE) or other known processes, depending on the material composition of the layer.

In one example, a protective mask layer as set forth herein, e.g., a mask layers for patterning device layer 30 as set forth herein may include a material such as, for example, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in semiconductor structure. For instance, a protective mask layer may be or include an organic material. For instance, flowable oxide such as, for example, a hydrogen silsesquioxane polymer, or a carbon-free silsesquioxane polymer, may be deposited by flowable chemical vapor deposition (F-CVD). In another example, a protective mask layer may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Removing material of a layer as set forth herein, e.g., device layer 30 can be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material subject to removal.

One general aspect can include a semiconductor structure including: a substrate. The semiconductor structure also can include a substrate layer formed of silicon germanium. The semiconductor structure also can include a multilayer substructure formed over the substrate and under the substrate layer, where the multilayer substructure can include one or more first layer and one or more second layer, the one or more first layer formed of a first material, the one or more second layer formed of a second material different from a material of the one or more first layer.

Implementations may include one or more of the following features. The semiconductor structure where the semiconductor structure can include a device layer formed on the substrate layer. The semiconductor structure where the semiconductor structure can include a device layer formed on the substrate layer, the device layer formed of silicon. The semiconductor structure where the semiconductor structure can include a device layer formed on the substrate layer, the device layer formed of silicon germanium. The semiconductor structure where each of the first material and the second material is selected from the group including of silicon (Si), silicon germanium, silicon with carbon (Si:C), and silicon germanium with carbon (SiGe:C). The semiconductor structure where each of the one or more first layer and the one or more second layer has a thickness of about 20 nm or less. The semiconductor structure where each of the one or more first layer and the one or more second layer has a thickness of about 10 nm or less. The semiconductor structure where the multilayer substructure can include one or more third layer, the one or more third layer being formed of a material different from a material of the one or more first layer and the one or more second layer. The semiconductor structure where the multilayer substructure can include one or more layer formed of SiGe:C or Si:C having an atomic percent of germanium of between about 0% and about 40%. The semiconductor structure where the multilayer substructure can include one or more layer formed of SiGe:C having an atomic percent of germanium of between about 20% and about 25%. The semiconductor structure where the multilayer substructure can include one or more layer formed of SiGe:C or Si:C having an atomic percent of carbon of between about 0% and about 1.5%. The semiconductor structure where the multilayer substructure can include one or more layer formed of SiGe:C or Si:C having an atomic percent of carbon of between about 0.4% and about 0.6%. The semiconductor structure where the multilayer substructure can include a plurality of first layers and a plurality of second layers, the plurality of first layers formed of a first material, the plurality of second layers formed of a second material different from the first material, where each of the first material and the second material is selected from the group including of silicon (Si), silicon germanium, silicon with carbon (Si:C), and silicon germanium with carbon (SiGe:C). The semiconductor structure where each of the one or more first layer and the one or more second layer has a thickness of about 20 nm or less. The semiconductor structure where at least one layer of the multilayer substructure is doped with a light atom implant. The semiconductor structure where at least one layer of the multilayer substructure is doped with a light atom implant selected from the group including of He and H. The semiconductor structure where the semiconductor structure can include a device layer, the substrate layer being adapted so that the substrate layer provides compression or tensile strain to the device layer. The semiconductor structure where the semiconductor structure can include a device layer, the substrate structure being adapted so that the substrate layer provides compression or tensile strain to the device layer, and where the semiconductor structure can include a device formed on the first layer. The semiconductor structure where each of layer of the multilayer substructure has a common thickness of about T/N where T is the total thickness of the multilayer substructure and N is the number of layers of the multilayer substructure. The semiconductor structure where the multilayer substructure can include a plurality of first layers and a plurality of second layers, the plurality of first layers formed of a first material, the plurality of second layers formed of a second material different from a material of the plurality of first layers, where each of the plurality of first layers has first substantially common thickness, and where each of the plurality of second layers has a second substantially common thickness, the second substantially common thickness being different from the first substantially common thickness.

One general aspect can include a method including: forming a multilayer substructure on a substrate. The method also can include annealing the multilayer substructure. The method also can include forming a substrate layer on the multilayer substructure.

Implementations may include one or more of the following features. The method where the multilayer substructure can include one or more first layer and one or more second layer, the one or more first layer formed of a first material, the one or more second layer formed of a second material different from a material of the one or more first layer. The method where each of the first material and the second material is selected from the group including of silicon (Si), silicon germanium, silicon with carbon (Si:C), and silicon germanium with carbon (SiGe:C). The method where each of the one or more first layer and the one or more second layer has a thickness of about 20 nm or less. The method where each of the one or more first layer and the one or more second layer has a thickness of about 10 nm or less. The method where the multilayer substructure can include one or more third layer, the one or more third layer being formed of a material different from a material of the one or more first layer and the one or more second layer. The method where the multilayer substructure can include one or more layer formed of SiGe:C or Si:C having an atomic percent of germanium of between about 0% and about 40%. The method where the multilayer substructure can include one or more layer formed of SiGe:C having an atomic percent of germanium of between about 20% and about 25%. The method where the multilayer substructure can include one or more layer formed of SiGe:C or Si:C having an atomic percent of carbon of between about 0% and about 1.5%. The method where the multilayer substructure can include one or more layer formed of SiGe:C or Si:C having an atomic percent of carbon of between about 0.4% and about 0.6%. The method where the annealing can include annealing at a temperature of a greater than 800 degrees C. The method where the annealing can include annealing at a temperature of between about 950 degrees C. and about 1000 degrees C. The method where the method can include doping one or more layer of the multilayer substructure with a light atom implant. The method where the method can include doping one or more layer of the multilayer substructure with a light atom implant selected from the group including of He and H.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, forms of the term "define" encompass relationships where an element is partially defines as well as relationships where an element is entirely defined. Furthermore, a device or structure that is configured in a certain way is configured in at least that way, but may also be configured in ways that are not listed. Where a method or apparatus herein is described as having a certain number of elements the method or apparatus can be practiced with fewer than or greater than the certain number of elements.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:
1. A method comprising:
   forming a multilayer substructure on a substrate;
   annealing the multilayer substructure at a temperature of a greater than 800 degrees C.; and
   wherein the multilayer substructure includes one or more first layer and one or more second layer, the one or more first layer formed of a first material, the one or more second layer formed of a second material different from a material of the one or more first layer, and each of the first material and the second material is selected from the group consisting of silicon (Si), silicon germanium (SiGe), silicon with carbon (Si:C), and silicon germanium with carbon (SiGe:C); and
   forming a substrate layer on the multilayer substructure.

2. The method of claim 1, wherein the annealing includes annealing at a temperature of between about 950 degrees C. and about 1000 degrees C.

3. The method of claim 1, wherein the method includes doping one or more layer of the multilayer substructure with a light atom implant.

4. The method of claim 1, wherein the method includes doping one or more layer of the multilayer substructure with a light atom implant selected from the group consisting of He and H.

5. The method of claim 1, wherein the method is further characterized by one or more of the following selected from the group consisting of (a) each of the one or more first layer and the one or more second layer has a thickness of about 20 nm or less, and (b) each of the one or more first layer and the one or more second layer has a thickness of about 10 nm or less.

6. The method of claim 1, wherein the multilayer substructure includes one or more third layer, the one or more third layer being formed of a material different from a material of the one or more first layer and the one or more second layer.

7. The method of claim 1, wherein the method is further characterized by one or more of the following selected from the group consisting of (a) the multilayer substructure includes one or more layer formed of SiGe:C or Si:C having an atomic percent of germanium of between about 0% and about 40%, (b) the multilayer substructure includes one or more layer formed of SiGe:C having an atomic percent of germanium of between about 20% and about 25%, (c) the multilayer substructure includes one or more layer formed of SiGe:C or Si:C having an atomic percent of carbon of between about 0% and about 1.5%, and (d) the multilayer substructure includes one or more layer formed of SiGe:C or Si:C having an atomic percent of carbon of between about 0.4% and about 0.6%.

8. A method comprising:
forming a multilayer substructure on a substrate;
annealing the multilayer substructure;
forming a substrate layer on the multilayer substructure; and
wherein the method is further characterized by one or more of the following selected from the group consisting of (a) the multilayer substructure includes one or more layer formed of SiGe:C or Si:C having an atomic percent of germanium of between about 0% and about 40%, (b) the multilayer substructure includes one or more layer formed of SiGe:C having an atomic percent of germanium of between about 20% and about 25%, (c) the multilayer substructure includes one or more layer formed of SiGe:C or Si:C having an atomic percent of carbon of between about 0% and about 1.5%, and (d) the multilayer substructure includes one or more layer formed of SiGe:C or Si:C having an atomic percent of carbon of between about 0.4% and about 0.6%.

9. A method comprising:
forming a multilayer substructure on a substrate;
annealing the multilayer substructure at a temperature of a greater than 800 degrees C.;
forming a substrate layer on the multilayer substructure;
wherein the multilayer substructure includes one or more first layer and one or more second layer, the one or more first layer formed of a first material, the one or more second layer formed of a second material different from a material of the one or more first layer; and
wherein the method is further characterized by one or more of the following selected from the group consisting of (a) each of the one or more first layer and the one or more second layer has a thickness of about 20 nm or less, and (b) each of the one or more first layer and the one or more second layer has a thickness of about 10 nm or less.

10. The method of claim 8, wherein the method includes doping one or more layer of the multilayer substructure with a light atom implant.

11. The method of claim 8, wherein the method includes doping one or more layer of the multilayer substructure with a light atom implant selected from the group consisting of He and H.

12. The method of claim 8, wherein the multilayer substructure includes one or more third layer, the one or more third layer being formed of a material different from a material of the one or more first layer and the one or more second layer.

13. The method of claim 9, wherein the method includes doping one or more layer of the multilayer substructure with a light atom implant.

14. The method of claim 9, wherein the method includes doping one or more layer of the multilayer substructure with a light atom implant selected from the group consisting of He and H.

15. The method of claim 9, wherein the multilayer substructure includes one or more third layer, the one or more third layer being formed of a material different from a material of the one or more first layer and the one or more second layer.

* * * * *